(12) United States Patent
Lee

(10) Patent No.: US 7,288,959 B1
(45) Date of Patent: Oct. 30, 2007

(54) APPARATUS FOR CONTROLLING ON-DIE TERMINATION

(75) Inventor: Dong-Uk Lee, Gyeonggi-do (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 11/637,083

(22) Filed: Dec. 12, 2006

(30) Foreign Application Priority Data

Jan. 16, 2006 (KR) .................. 10-2006-0004366

(51) Int. Cl.
*H03K 19/003* (2006.01)
*H03B 1/00* (2006.01)

(52) U.S. Cl. .......................... 326/30; 327/108
(58) Field of Classification Search .............. 326/30; 327/108
See application file for complete search history.

(56) References Cited

U.S. PATENT DOCUMENTS

| | | | |
|---|---|---|---|
| 6,026,456 A | 2/2000 | Ilkbahar | |
| 6,157,206 A | 12/2000 | Taylor et al. | |
| 6,809,546 B2 | 10/2004 | Song et al. | |
| 6,924,660 B2 * | 8/2005 | Nguyen et al. | ............... 326/30 |
| 6,928,007 B2 | 8/2005 | Jin | |
| 7,019,555 B2 | 3/2006 | Lee | |
| 7,034,565 B2 | 4/2006 | Lee | |
| 7,034,567 B2 | 4/2006 | Jang | |
| 7,064,989 B2 | 6/2006 | Na et al. | |
| 7,138,823 B2 * | 11/2006 | Janzen et al. | ................. 326/30 |
| 7,151,390 B2 * | 12/2006 | Nguyen et al. | ............... 326/30 |
| 7,176,711 B2 * | 2/2007 | Park et al. | ..................... 326/30 |
| 7,205,787 B1 * | 4/2007 | Massoumi et al. | ............ 326/30 |
| 7,218,155 B1 * | 5/2007 | Chang et al. | ............... 327/108 |
| 7,221,193 B1 * | 5/2007 | Wang et al. | ................ 327/108 |

FOREIGN PATENT DOCUMENTS

| | | |
|---|---|---|
| JP | 2004310981 | 11/2004 |
| JP | 2005228458 | 8/2005 |
| JP | 2006129423 | 5/2006 |
| KR | 1020030083237 A | 10/2003 |
| KR | 1020030090955 A | 12/2003 |

* cited by examiner

*Primary Examiner*—Evan Pert
(74) *Attorney, Agent, or Firm*—Venable, LLP; Jeffri A. Kaminski

(57) ABSTRACT

An on-die termination control unit turns on/off a corresponding transistor according to a code signal and adjusts an on-die termination resistance so it is equal to an external resistance. An offset compensating unit detects an offset voltage from an output voltage of the on-die termination control unit, stores the detected offset voltage in a capacitor, compares the capacitor voltage canceled the offset voltage with a preset reference voltage, and outputs the comparison result. A latch stores the output of the offset compensating unit for a predetermined time. A counter counts the output of the latch and increases or decreases the code signal.

29 Claims, 5 Drawing Sheets

APPARATUS FOR CONTROLLING ON-DIE TERMINATION

BACKGROUND OF THE INVENTION

1. Technical Field

The present invention relates to an apparatus for controlling on-die termination, and more particularly, to an apparatus for controlling on-die termination that is capable of improving calibration accuracy.

2. Related Art

In a high speed semiconductor apparatus, the swing widths of signals that interface with the semiconductor apparatus have decreased such that a delay time necessary for signal transmission has been minimized. However, when the swing width of a signal is reduced, the influence of external noise on the signal, and reflection of the signal is high due to the mismatching of impedances at an interface terminal. The mismatching of impedance occurs due to the external noise, variations in a power supply voltage, variations in the operation temperature, variations in the manufacturing processes, and the like.

When mismatching of impedance occurs, it is difficult for data to be transmitted at high speed, and data output from a data output terminal of a semiconductor device may be distorted. That is, when resistance is not appropriately matched, a transmitted signal is reflected, and it is likely for an error to occur during signal transmission.

Further, when an external fixed resistance is used in the semiconductor apparatus, the external impedance cannot be appropriately matched with the internal impedance because of aging of an integrated circuit, temperature variations in the integrated circuit, or differences in manufacturing processes. Thus, when a semiconductor apparatus receives a distorted signal through an input terminal, it may cause a problem such as a set-up/hold failure or an input level determination error.

In order to make an internal resistance (i.e., impedance) equal to an external reference resistance, a technique has been suggested in which the resistance of a termination terminal is adjusted by adjusting the number of turned-on transistors among a plurality of transistors that are connected in parallel to one another.

Meanwhile, in a high speed semiconductor apparatus, an impedance matching circuit, called an on-chip termination or on-die termination is provided near a pad in an IC chip. In particular, various new concepts have been added in order to control the data transmitting speed in a DDR (Double Data Rate) memory apparatus. In all of them, resistance at the termination is necessary to achieve smooth signal transmission between elements.

FIG. 1 is a circuit diagram illustrating a structure of an apparatus for controlling on-die termination according to the related art.

The apparatus for controlling on-die termination (ODT) includes an on-die termination control unit 10, an external resistor R5, a comparator 20, a latch 30, and a counter 40.

In this case, the on-die termination control unit 10 includes a plurality of PMOS transistors P0 to P4, and a plurality of resistors R0 to R4 that are respectively connected to the plurality of PMOS transistors P0 to P4. The plurality of PMOS transistors P0 to P4 are supplied with a code signal <0:4> through respective gate terminals. The external resistor R5 is connected between the on-die termination control unit 10 and a ground voltage terminal, and is generally called a ZQ resistor in memory superior to DDR2.

The comparator 20 is supplied with the signal of a node A through a positive terminal +(namely the output signal of the on-die termination control unit 10), and is supplied with a reference voltage Vref having a value of VDD/2 through a negative terminal −.

The latch 30 latches the output of the comparator 20.

The counter 40 counts the output of the latch 30, and outputs a code signal code<0:4> using the counted latch signal.

The operation of the apparatus for controlling on-die termination according to the related art with the above-described structure will be described below.

First, the comparator 20 compares the output of the on-die termination control unit 10 and the reference voltage Vref, and outputs a high level signal or a low level signal.

For example, if the resistance of the on-die termination control unit 10 is smaller than the resistance of the external resistor R5, the voltage at the node A becomes larger than the reference voltage Vref, and node B, which is an output terminal of the latch 30, becomes a high level. Further, if the node B becomes a high level, a least significant bit (LSB) code in a five-bit code signal code<0:4> of the counter 40 increases by '1'. As such, if the code is increased by 1, a corresponding transistor among the plurality of PMOS transistors P0 to P4 of the on-die termination control unit 10 is turned off, and an on-die termination resistance increases.

Conversely, if the resistance of the on-die termination control unit 10 is larger than the resistance of the external resistor R5, the voltage at the node A becomes smaller than the reference voltage Vref, and the node B, which is the output terminal of the latch 30, becomes a low level. Further, if the node B becomes a low level, the least significant bit (LSB) code in the five-bit code signal code<0:4> of the counter 40 is decreased by '1'. As such, if the code decreases by 1, the corresponding transistor among the plurality of PMOS transistors P0 to P4 of the on-die termination control unit 10 is turned on, and the on-die termination resistance decreases.

As the on-die termination resistance decreases or increases, the resistance of the external resistor R5 becomes equal to the resistance of the on-die termination.

However, in the apparatus for controlling on-die termination according to the related art, an offset voltage Vos exists at a positive terminal +of the comparator 20. As a result, a voltage that corresponds to "the voltage of the node A+the offset voltage Vos" is supplied to the comparator 20. Therefore, the comparator 20 compares the voltage at the node A plus the offset voltage Vos and the reference voltage Vref, and sets a different on-die termination resistance than the actual resistance of the external resistor R5.

In this case, it is not possible to implement accurate on-die termination according to the external resistance, and thus the accuracy of on-die termination calibration is not reliable. Further, the on-die termination and current characteristics of a driver cannot be improved. As a result, it is not possible to implement a high speed memory that requires a high frequency operation.

SUMMARY OF THE INVENTION

An embodiment of the present invention provides an apparatus for controlling on-die termination that is capable of improving calibration accuracy.

Another embodiment of the present invention provides an apparatus for controlling on-die termination that is capable of preventing erroneous operation due to an offset voltage.

Still another embodiment of the present invention provides an apparatus for controlling on-die termination that is capable of correcting an NMOS driving unit using a code signal generated in the apparatus for controlling on-die termination and creating an accurate value of a driver.

A first embodiment of the present invention provides an apparatus for controlling on-die termination, which includes an on-die termination control unit that turns on/off a corresponding transistor according to a code signal and adjusts the on-die termination resistance so it is equal to an external resistance; an offset compensating unit that detects an offset voltage from the output voltage of the on-die termination control unit, stores the detected offset voltage in a capacitor, compares the capacitor voltage canceled offset voltage with a preset reference voltage, and outputs the comparison result; a latch that stores the output of the offset compensating unit for a predetermined time; and a counter that counts the output of the latch and increases or decreases the code signal.

Preferably, the on-die termination control unit may include a plurality of PMOS transistors that are supplied with a power supply voltage through their respective source terminals and are supplied with the code signal through their respective gate terminals, and a plurality of resistors that are respectively connected to the drain terminals of the plurality of PMOS transistors.

Preferably, the offset compensating unit may form a negative feedback loop and store the offset voltage in the capacitor, when a first pulse signal is activated. When a second pulse signal is activated, the offset voltage stored in the capacitor is canceled and the capacitor voltage canceled offset voltage is compared with the reference voltage.

Preferably, the first pulse signal may precharge the offset compensating unit, and the second pulse signal is activated during an interval when the first pulse signal is not activated.

Preferably, the offset compensating unit may include a comparator that compares, when the second pulse signal is not activated, the output signal of the on-die termination control unit with the reference voltage; the capacitor that is connected between the on-die termination control unit and the comparator; and a switching unit that stores the offset voltage in the capacitor and outputs a sum of the reference voltage and the offset voltage to the comparator when the first pulse signal is activated, and outputs the reference voltage and the output of the on-die termination control unit, having canceled the offset voltage, to the comparator when the second pulse signal is activated.

Preferably, the comparator may have a unity gain and output the sum of the reference voltage and the offset voltage when the first pulse signal is activated.

Preferably, the switching unit may include a first transmission gate that is switched according to the second pulse signal and an inverted signal of the second pulse signal, and outputs the reference voltage to a first node; a second transmission gate that is switched according to the second pulse signal and the inverted signal of the second pulse signal, and outputs the output of the on-die termination control unit to a second node; a third transmission gate that is switched according to the first pulse signal and an inverted signal of the first pulse signal, and selectively connects the first node and the second node; a fourth transmission gate that is switched according to the first pulse signal and the inverted signal of the first pulse signal, and selectively controls the connection between an output terminal of the capacitor and a reference voltage applying terminal; and a fifth transmission gate that is switched according to the first pulse signal and the inverted signal of the first pulse signal, and selectively controls the connection between an output terminal of the comparator and a negative terminal of the comparator.

Preferably, the latch and the counter may be activated or not activated according to a third pulse signal.

Preferably, the third pulse signal may be activated during an interval of when the second pulse signal is activated.

A second embodiment of the present invention provides an apparatus for controlling on-die termination, which includes an on-die termination control unit that selectively turns on/off a corresponding transistor among a first transistor group according to a first code signal and adjusts an on-die termination resistance; an offset compensating unit that detects an offset voltage from an output voltage of the on-die termination control unit, stores the detected offset voltage in a capacitor, destroys the stored offset voltage in the capacitor, compares the capacitor voltage canceled stored offset voltage with a preset reference voltage, and outputs the comparison result; a latch that stores the output of the offset compensating unit for a predetermined time; a counter that counts the output of the latch, increases or decreases the first code signal, and outputs a second code signal; and a driving control unit that selectively turns on/off a corresponding transistor among a second transistor group according to the second code signal and adjusts an output resistance.

Preferably, the driving control unit may include a plurality of second resistors that are connected to the on-die termination control unit, and a plurality of NMOS transistors that are connected in common to a ground voltage terminal through their source terminals, are supplied with the second code signal through their respective gate terminals, and are respectively connected to the plurality of second resistors through their respective drain terminals.

A third embodiment of the present invention provides an apparatus for controlling on-die termination, which includes an on-die termination control unit that turns on/off a corresponding transistor according to a code signal and adjusts an on-die termination resistance so it is equal to an external resistance; an external resistor that is connected to the on-die termination control unit, an offset voltage destroying unit that is connected to an output node of the on-die termination control unit; a comparator that receives a reference voltage at one input terminal and where the other input terminal is connected to the offset voltage destroying unit, and that compares voltage input to the respective input terminals; and a counter that increases or decreases the code signal using an output signal of the comparator.

Preferably, the apparatus further includes a latch that latches the output signal of the comparator, and transmits the latched output signal to the counter.

DESCRIPTION OF EXEMPLARY EMBODIMENTS

Figure 1:
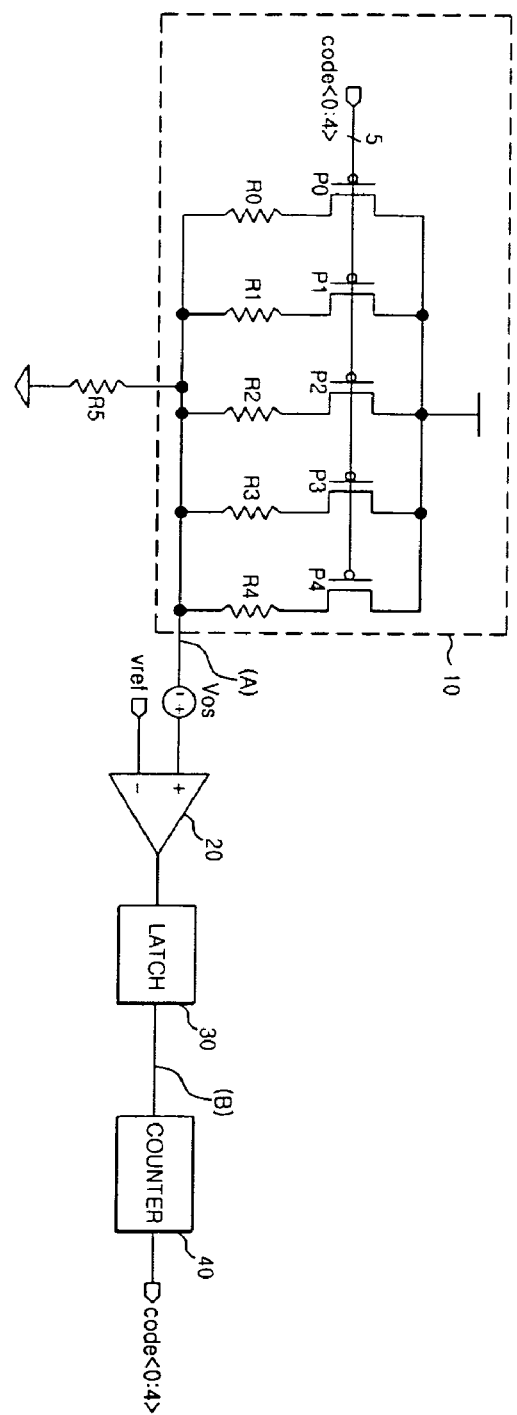
FIG. 1 is a circuit diagram of an apparatus for controlling on-die termination according to the related art.

Embodiments of the present invention will now be described in detail with reference to the accompanying drawings. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity.

Figure 2:
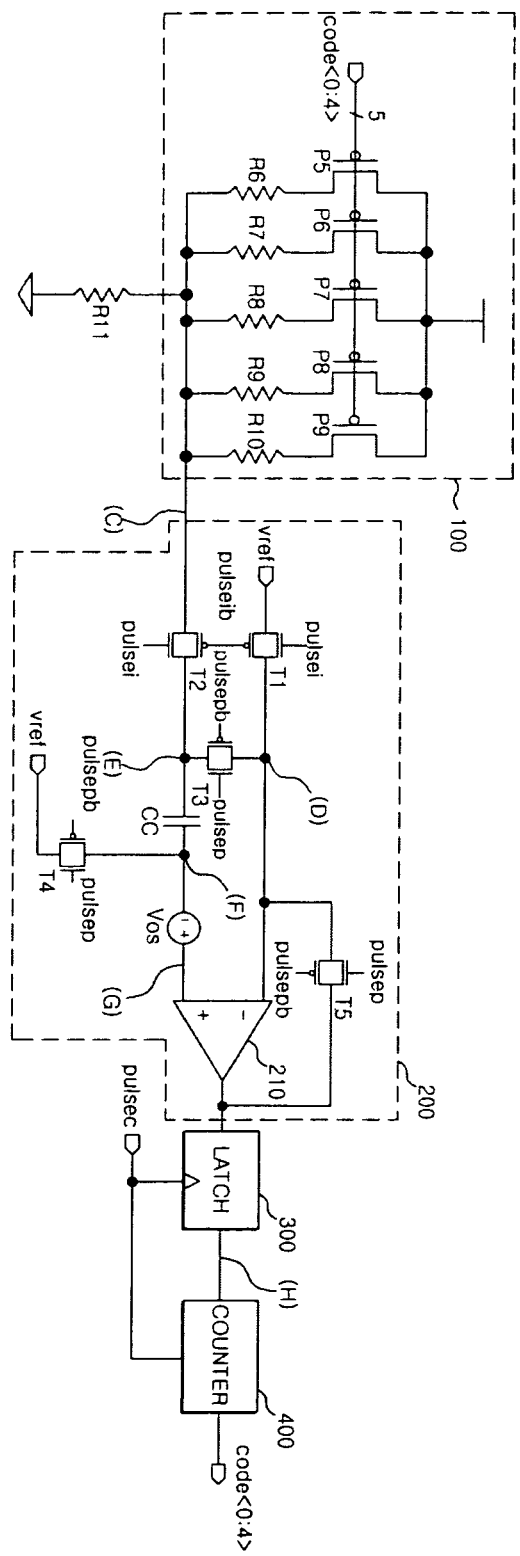
FIG. 2 is a circuit diagram of an apparatus for controlling on-die termination according to an embodiment of the present invention.

Referring to FIG. 2, an apparatus for controlling on-die termination (ODT) according to an embodiment of the present invention includes an on-die termination control unit 100, an external resistor R11, an offset compensating unit 200, a latch 300, and a counter 400.

The on-die termination control unit 100 includes a plurality of PMOS transistors P5 to P9, and a plurality of resistors R6 to R10. The source terminal of each of the plurality of PMOS transistors P5 to P9 is connected in common to a power supply voltage terminal, and the gate terminal of each of the plurality of PMOS transistors P5 to P9 receives a code signal <0:4>, respectively. In addition, the plurality of resistors R6 to R10 are respectively connected to drain terminals of the plurality of PMOS transistors P5 to P9. Further, an external resistor R11 is connected between the on-die termination control unit 100 and a ground voltage terminal. The transistors P5 to P9 configuring the on-die termination control unit 100 are selectively turned on according to the code signal <0:4>, thereby adjusting an on-die termination resistance so it is equal to an external resistance.

The external resistor R11 is connected to the on-die termination control unit 100.

Figure 7:
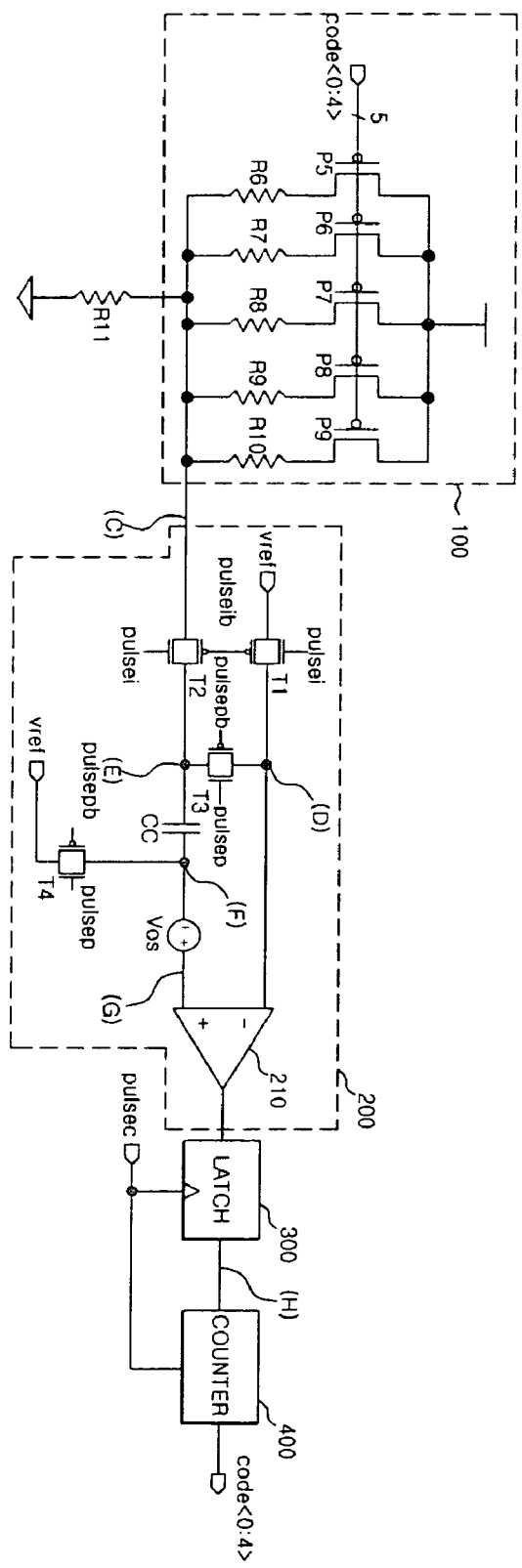
FIG. 7 is a circuit diagram of an apparatus for controlling on-die termination according to a still another embodiment of the present invention.

The offset compensating unit 200 includes a plurality of transmission gates T1 to T5, a capacitor CC, and a comparator 210. In this embodiment, the comparator 210 is included in the offset compensating unit 200, because an output voltage of the comparator 210 is used for an offset compensating operation as pulse signals are activated. However, considering the technical scope of the present invention various modifications can be made, for example, to the structure of the offset compensating unit 200 shown in FIG. 2. For example, as shown in FIG. 7, a circuit structure may be used in which the offset compensating unit is provided only in an output terminal of the comparator 210 without using the transmission gate T5.

The transmission gate T1 that forms part of the offset compensating unit 200 selectively outputs a reference voltage Vref that has a value of VDD/2 on the basis of pulse signals pulsei and pulseib. The transmission gates T2 and T1 are turned on/off at the same time, and the transmission gate T2 selectively outputs a signal of a node C according to the states of the pulse signals pulsei and pulseib. The pulse signal pulseib has a phase that is opposite to that of the pulse signal pulsei. The transmission gate T3 selectively connects a node D and a node E on the basis of pulse signals pulsep and pulsepb. In this case, the transmission gate T3 is provided to perform a negative feedback loop for offset compensation. The capacitor CC for offset compensation is connected between node E and node F. Further, the transmission gate T4 selectively outputs the reference voltage Vref to the node F according to the states of the pulse signals pulsep and pulsepb. In this case, the transmission gate T4 applies the reference voltage Vref to the negative feedback loop. The transmission gate T5 selectively outputs the output signal of the comparator 210 to node D (or node F) according to the states of the pulse signals pulsep and pulsepb. The pulse signal pulsepb has a phase that is opposite to that of the pulse signal pulsep. The comparator 210 receives the output signal of the node G through a positive terminal +, and the output of the node D through a negative terminal −. In this case, the comparator 210 is composed of a general differential amplifier.

The offset compensating unit 200 having the above-described structure detects an offset voltage from the output voltage of the on-die termination control unit 100, stores the detected offset voltage in the capacitor CC, and compares the stored offset voltage and a preset reference voltage Vref. The offset compensating unit 200 uses a transmission gate as a switch for performing an on/off function, and uses the pulse signal and inverted pulse signal pulsep and pulsepb as signals for controlling the transmission gate to minimize noise due to coupling of the capacitor at the time of signal transmission. In considering space requirements, the offset compensating unit 200 may use an NMOS transistor as the switch, but it is not preferable since the NMOS transistor has a large amount of coupling noise for a signal occurs. Therefore, it is preferable that the transmission gate be used as the switch.

The latch 300 stores the output signal of the offset compensating unit 200 for a predetermined time. The latch 300 latches the output signal of the comparator 210 according to a pulse signal pulsec. The counter 400 counts the output signal of the latch 300 and outputs the code signal code<0:4> generated by the output signal of the latch 300.

The operation of the apparatus for controlling on-die termination having the above-described structure will be described with reference to FIGS. 3 to 5.

Figure 3:
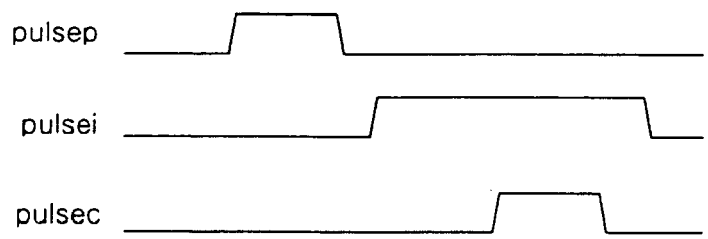
FIG. 3 is a waveform diagram of each pulse for the offset compensating unit of FIG. 2.

First, in order to drive the offset compensating unit 200, the latch 300, and the counter 400 in the apparatus for controlling on-die termination, three pulses are necessary, and waveform characteristics of the three pulses are as shown in FIG. 3.

Referring to FIG. 3, the pulse signal pulsep is a pulse that precharges the offset compensating unit 200.

Figure 4:
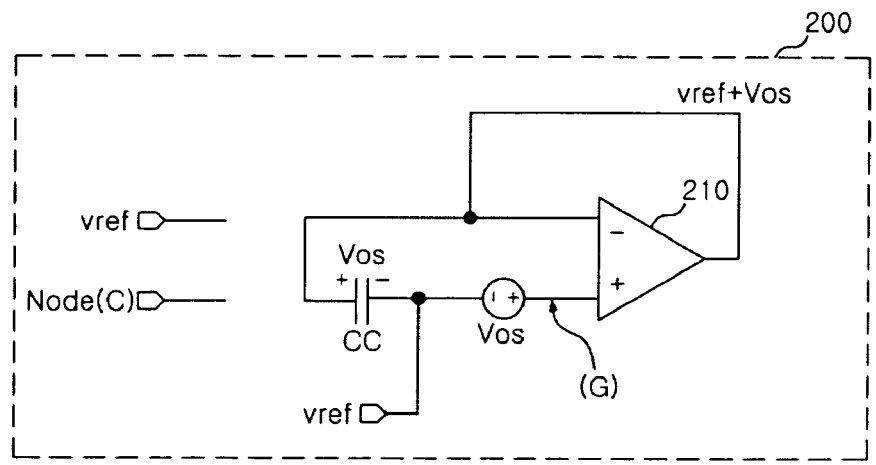
FIGS. 4 and 5 are circuit diagrams of part of the offset compensating unit of FIG. 2.
Figure 5:
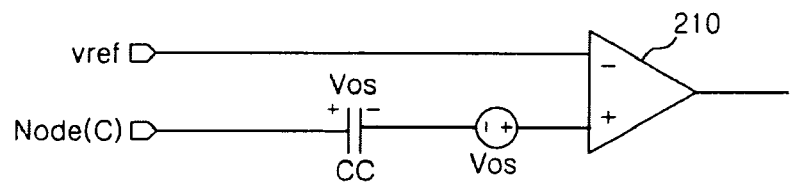

First, as shown in FIG. 4, when the pulse signal pulsep becomes active and the pulse signal pulsei does not become active, the input of the comparator 210 is intercepted, and the comparator 210 operates as a negative feedback loop having a unity gain. That is, when the pulse signal pulsep becomes active and the pulse signal pulsei does not become active, the transmission gates T1 and T2 are turned off, and the transmission gates T3 to T5 are turned on. Therefore, a voltage corresponding to "a reference voltage Vref+an offset voltage Vos" is supplied to a positive terminal +of the comparator 210. The comparator 210 has a unity gain and the output of the comparator 210 becomes a voltage corresponding to "a reference voltage Vref+an offset voltage Vos" that is the same as the voltage at the positive terminal +. Therefore, 'a negative offset voltage' that corresponds to a difference between the reference voltage Vref and "the reference voltage Vref+the offset voltage Vos", that is, '−Vos' is stored in the capacitor CC.

Meanwhile, the pulse signal pulsei (see FIG. 3) is a control signal that is activated during an interval when the pulse signal pulsep is not activated. Therefore, when the pulse signal pulsep becomes a low level, the pulse signal pulsei becomes a high level, and a comparison is performed by the comparator 210.

That is, when the pulse signal pulsep becomes a low level and the pulse signal pulsei becomes a high level, the transmission gates T1 and T2 are turned on, and the transmission gates T3 to T5 are turned off. As a result, as shown in the circuit of FIG. 5, the reference voltage Vref is supplied to the negative (−) input terminal of the comparator 210, and the capacitor CC is connected to the node C and the positive (+) input terminal of the comparator 210. Therefore, the negative offset voltage corresponding to 'a previously stored value', that is, '−Vos' is supplied to the capacitor CC. Since the offset voltage Vos exists between the capacitor CC and the comparator 210, the offset voltage Vos and the negative offset voltage −Vos cancel each other out. That is, since the offset voltage Vos is canceled out by the negative offset voltage −Vos stored in the capacitor CC, a voltage at the node C is compared with the reference voltage Vref. Therefore, at the time of the comparison operation by the comparator 210, an intrinsic on-die termination value obtained by removing the offset voltage can be compared with the external resistance.

Further, the pulse signal pulsec is a signal that is activated during an interval when the pulse signal pulsei is activated. Therefore, when the pulse signal pulsec is activated, the compared result is latched by the latch 300, and the value of a code signal <0:4> corresponding to the output signal of the counter 400 varies. That is, the comparator 210 compares the output signal of the on-die termination control unit 100 and the reference voltage Vref and outputs a high level signal or a low level signal.

For example, when a resistance of the on-die termination control unit 100 is smaller than the resistance of the external resistor R11, a voltage at the node C becomes larger than the reference voltage Vref, and a voltage at the node H becomes a high level. When a voltage at the node H becomes a high level, a least significant bit (LSB) code of a five-bit code signal code<0:4> of the counter 400 increases by 1. Therefore, among the PMOS transistors P5 to P9 of the on-die termination control unit 100, a PMOS transistor receiving the increased code value is turned off, and the on-die termination resistance increases.

In contrast, when the resistance of the on-die termination control unit 100 is larger than a resistance of the external resistor R11, a voltage at the node C becomes smaller than the reference voltage Vref, and a voltage at the node H becomes a low level. When a voltage at the node H becomes a low level, a least significant bit (LSB) code of a five-bit code signal code<0:4> of the counter 400 decreases by 1. Therefore, among the PMOS transistors P5 to P9 of the on-die termination control unit 100, a PMOS transistor receiving the decreased code value is turned on, and the on-die termination resistance decreases.

In this way, the on-die termination resistance decreases or increases, and the resistance of the external resistor R11 becomes equal to the on-die termination resistance. Since calibration is performed until the resistance of the external resistor R11 becomes equal to the on-die termination resistance, reliability can be improved. Improved reliability is achieved by removing the offset voltage, as described above.

Figure 6:
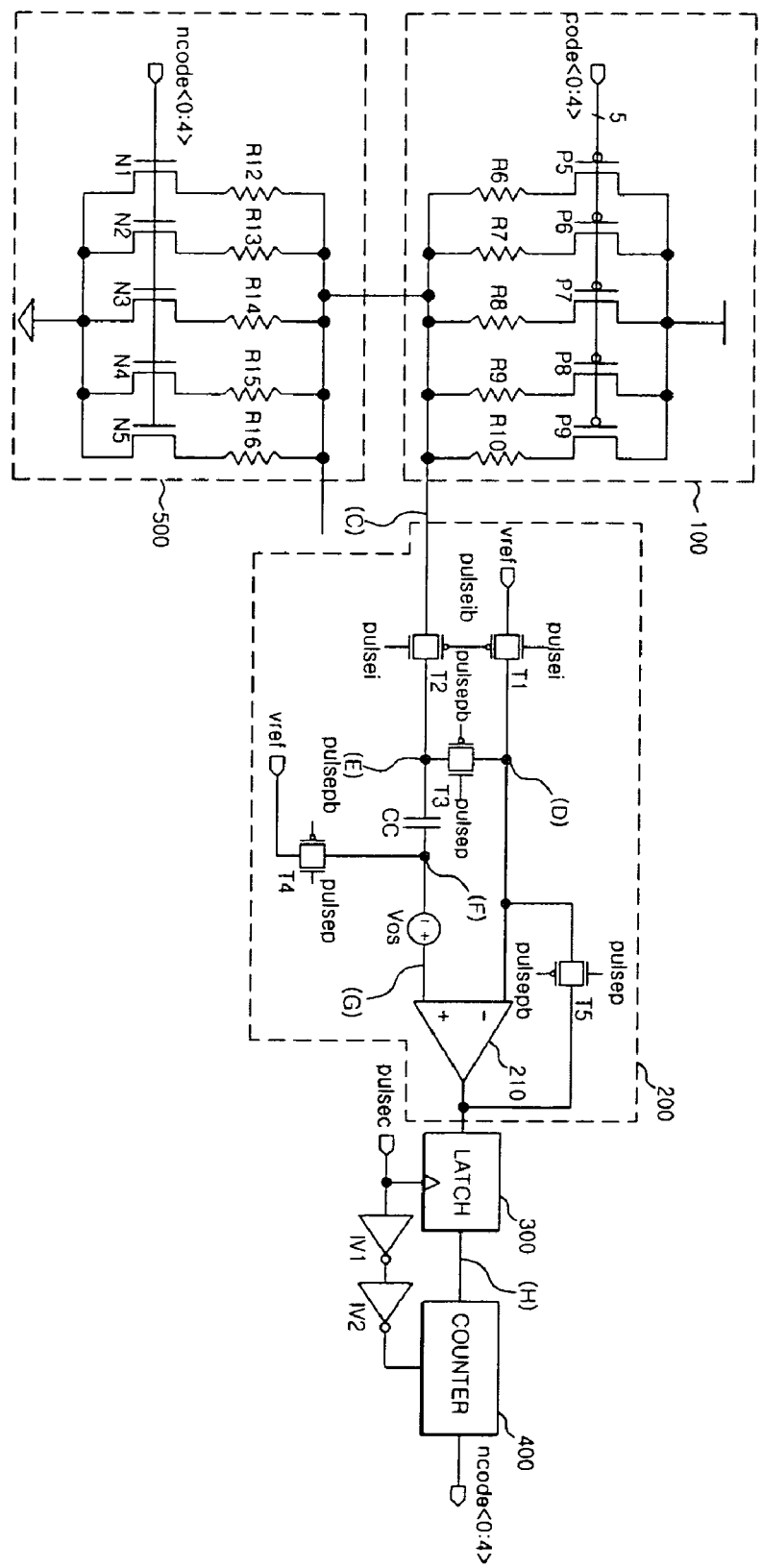
FIG. 6 is a circuit diagram of an apparatus for controlling on-die termination according to another embodiment of the present invention.

FIG. 6 is a circuit diagram illustrating a structure of an apparatus for controlling on-die termination according to another embodiment of the invention.

Referring to FIG. 6, an apparatus for controlling on-die termination includes a control unit 100, an offset compensating unit 200, a latch 300, a counter 400, and a driving control unit 500. That is, this embodiment is different from the above-described embodiment in that a plurality of NMOS drivers N1 to N5 are provided, instead of the external resistor R11.

As in the above-described embodiment, the on-die termination control unit 100 according to this embodiment turns on/off a corresponding transistor among a first transistor group according to a first code signal <0:4>, and adjusts the on-die termination resistance.

The offset compensating unit 200 detects an offset voltage Vos from the output voltage of the on-die termination control unit 100, stores the detected offset voltage in the capacitor CC, and compares the capacitor voltage having canceled out the offset voltage and a preset reference voltage Vref.

The latch 300 stores the output of the offset compensating unit 200 for a predetermined time.

The counter 400 counts the output of the latch 300, and increases or decreases the first code signal code<0:4> to generate and output a second code signal ncode<0:4>.

The driving control unit 500 includes a plurality of NMOS drivers. Also, the driving control unit 500 includes a plurality of resistors R12 to R16, and a plurality of NMOS transistors N1 to N5. The plurality of resistors R12 to R16 are connected to the on-die termination control unit 100, and the drain terminals of the plurality of NMOS transistors N1 to N5 are respectively connected to the plurality of resistors R12 to R16. The source terminals of the plurality of NMOS transistors N1 to N5 are connected in common to a ground voltage terminal. The plurality of NMOS transistors N1 to N5 receive the second code signal ncode<0:4> through the respective their gate terminals. As a result, a corresponding transistor among a second transistor group N1 to N5 is selectively turned on/off according to the code signal ncode<0:4> so as to adjust the output resistance.

In the embodiment of FIG. 6 having the above-described structure, the second code signal ncode<0:4> for calibrating an NMOS driving unit is generated by using the code signal code<0:4>. In the embodiment shown in FIG. 6, since an on-die termination calibration operation through offset compensation is the same as that of FIG. 2, a detailed operation description thereof is omitted.

According to the embodiment of FIG. 6, the generated code signal ncode<0:4> is increased or decreased after controlling the on-die termination resistance. This code signal ncode<o:4> is input to the driving control unit 500. A NMOS transistor receiving the increased code signal ncode<0:4> among the NMOS transistors N1 to N5 is turned on or a NMOS transistor receiving the decrease code signal ncode<0:4> among the NMOS transistor N1 to N5 is turned off. Thus a resistance for correction of the NMOS driving unit is adjusted.

As described above, according to embodiments of the present invention, the following effects can be obtained. First, the offset voltage input to the comparator at the time of adjusting the ODT (On-Die Termination) is compensated for through the capacitor. Therefore, the external resistance can be made to be equal to the on-die termination value, thereby improving the current characteristic.

Second, the calibration accuracy of the on-die termination can be improved by removing the offset voltage input to the comparator at the time of adjusting the on-die termination. Therefore, it is possible to implement a next generation memory in which a high-speed output operation is required.

Third, the NMOS driving unit is corrected by using a code signal generated in an on-die termination circuit so as to generate an accurate driver value, thereby improving the operation frequency.

It will be apparent to those skilled in the art that various modifications and changes may be made without departing from the scope and spirit of the present invention. Therefore, it should be understood that the above embodiments are not limiting, but illustrative in all aspects. The scope of the invention is defined by the appended claims rather than by the description preceding them, and therefore all changes and modifications that fall within the metes and bounds of the claims, or equivalents of such metes and bounds are therefore intended to be embraced by the claims.

What is claimed is:

1. An apparatus for controlling on-die termination, comprising:
an on-die termination control unit configured to turn on/off a corresponding transistor according to a code signal and adjust an on-die termination resistance so it is equal to an external resistance and to produce an output voltage;
an offset compensating unit configured to detect an offset voltage from the output voltage of the on-die termination control unit, store the detected offset voltage in a capacitor, compare the capacitor voltage with a preset reference voltage, and output a comparison result;
a latch configured to store the comparison result for a predetermined time and to provide an output; and
a counter configured to count the output of the latch and increase or decrease the code signal based on the count.

2. The apparatus of claim 1,
wherein the on-die termination control unit includes:
a plurality of PMOS transistors configured to receive a power supply voltage through respective source terminals, configured to receive the code signal through respective gate terminals and including respective drain terminals; and
a plurality of resistors respectively coupled to the drain terminals of the plurality of PMOS transistors.

3. The apparatus of claim 1,
wherein the offset compensating unit forms a negative feedback loop and stores the offset voltage in the capacitor when a first pulse signal is activated, and
wherein the offset compensating unit cancels the offset voltage stored in the capacitor, and compares the capacitor voltage having canceled out the offset voltage with the reference voltage, when a second pulse signal is activated.

4. The apparatus of claim 3,
wherein the first pulse signal precharges the offset compensating unit, and
the second pulse signal is activated during an interval when the first pulse signal is not activated.

5. The apparatus of claim 3,
wherein the offset compensating unit includes:
a comparator configured to compare the output voltage of the on-die termination control unit with the reference voltage when the second pulse signal is activated;
the capacitor coupled between the on-die termination control unit and the comparator; and
a switching unit configured to store the offset voltage in the capacitor and output a sum of the reference voltage and the offset voltage to the comparator when the first pulse signal is activated, and output the reference voltage and the output voltage of the on-die termination control unit having canceled out the offset voltage to the comparator, when the second pulse signal is activated.

6. The apparatus of claim 4,
wherein the offset compensating unit includes:
a comparator configured to compare the output voltage of the on-die termination control unit with the reference voltage when the second pulse signal is activated;
the capacitor coupled between the on-die termination control unit and the comparator; and
a switching unit configured to store the offset voltage in the capacitor and output a sum of the reference voltage and the offset voltage to the comparator when the first pulse signal is activated, and output the reference voltage and the output voltage of the on-die termination control unit having canceled out the offset voltage to the comparator, when the second pulse signal is activated.

7. The apparatus of claim 6,
wherein the comparator has a unity gain and is configured to output the sum of the reference voltage and the offset voltage through an output terminal, when the first pulse signal is activated.

8. The apparatus of claim 6,
wherein the switching unit includes:
a first transmission gate that is switched according to the second pulse signal and an inverted signal of the second pulse signal, and outputs the reference voltage to a first node;
a second transmission gate that is switched according to the second pulse signal and the inverted signal of the second pulse signal, and outputs the output of the on-die termination control unit to a second node;
a third transmission gate that is switched according to the first pulse signal and an inverted signal of the first pulse signal, and selectively connects the first node and the second node;
a fourth transmission gate that is switched according to the first pulse signal and the inverted signal of the first pulse signal, and selectively controls connection between an output terminal of the capacitor and a reference voltage applying terminal; and
a fifth transmission gate that is switched according to the first pulse signal and the inverted signal of the first pulse signal, and selectively controls connection between an output terminal of the comparator and a negative terminal of the comparator.

9. The apparatus of claim 3,
wherein the latch and the counter are activated or not activated according to a third pulse signal.

10. The apparatus of claim 9,
wherein the third pulse signal is controlled to be activated during an interval of when the second pulse signal is activated.

11. An apparatus for controlling on-die termination, comprising:
an on-die termination control unit configured to selectively turn on/off a corresponding transistor among a first transistor group according to a first code signal and adjust an on-die termination resistance and to produce an output voltage;
an offset compensating unit configured to detect an offset voltage from the output voltage of the on-die termination control unit, store the detected offset voltage in a capacitor, compare the capacitor voltage with a preset reference voltage, and output a comparison result;
a latch that stores the comparison result for a predetermined time to provide an output;
a counter configured to count the output of the latch, increase or decrease the first code signal, and output a second code signal based thereon; and
a driving control unit configured to selectively turn on/off a corresponding transistor among a second transistor group according to the second code signal to adjust an output resistance.

12. The apparatus of claim 11,
wherein the on-die termination control unit includes:
a plurality of PMOS transistors configured to receive a power supply voltage through a common source terminal, configured to receive the first code signal through a common gate terminal and including respective drain terminals; and
a plurality of first resistors that are respectively coupled to the drain terminals of the plurality of PMOS transistors.

13. The apparatus of claim 11,
wherein the driving control unit includes:
a plurality of second resistors coupled to the on-die termination control unit; and
a plurality of NMOS transistors coupled in common to a ground voltage terminal through their source terminals, supplied with the second code signal through respective gate terminals, and are respectively coupled to the plurality of second resistors through respective drain terminals.

14. The apparatus of claim 11,
wherein the offset compensating unit forms a negative feedback loop and stores the offset voltage in the capacitor when a first pulse signal is activated,
wherein the offset compensating unit is configured to cancel out the offset voltage stored in the capacitor and compare the capacitor voltage having canceled out the offset voltage with the reference voltage when a second pulse signal is activated.

15. The apparatus of claim 14,
wherein the offset compensating unit includes:
a comparator configured to compare the output voltage of the on-die termination control unit or an output signal of the driving control unit with the reference voltage when the second pulse signal is activated;
the capacitor coupled between the on-die termination control unit and the comparator; and
a switching unit configured to store the offset voltage in the capacitor and output a sum of the reference voltage and the offset voltage to the comparator when the first pulse signal is activated, and output the reference voltage and the output of the on-die termination control unit having canceled out the offset voltage to the comparator when the second pulse signal is activated.

16. The apparatus of claim 15,
wherein the switching unit includes:
a first transmission gate that is switched according to the second pulse signal and an inverted signal of the second pulse signal, and outputs the reference voltage to a first node;
a second transmission gate that is switched according to the second pulse signal and the inverted signal of the second pulse signal, and outputs the output signal of the on-die termination control unit to a second node;
a third transmission gate that is switched according to the first pulse signal and an inverted signal of the first pulse signal, and selectively connects the first node and the second node;
a fourth transmission gate that is switched according to the first pulse signal and the inverted signal of the first pulse signal, and selectively controls the connection between an output terminal of the capacitor and a reference voltage applying terminal; and
a fifth transmission gate that is switched according to the first pulse signal and the inverted signal of the first pulse signal, and selectively controls the connection between an output terminal of the comparator and a negative terminal of the comparator.

17. The apparatus of claim 14,
wherein the latch is activated according to a third pulse signal.

18. The apparatus of claim 17,
wherein the counter is activated during an interval when the second pulse signal is activated, according to the third pulse signal delayed for a predetermined time.

19. An apparatus for controlling on-die termination, comprising:
an on-die termination control unit having an output node and configured to turn on/off a corresponding transistor according to a code signal and adjust an on-die termination resistance so it is equal to an external resistance;
an external resistor coupled to the on-die termination control unit;
an offset voltage canceling unit coupled to the output node of the on-die termination control unit;
a comparator having one input terminal supplied with a reference voltage and another input terminal coupled to the offset voltage canceling unit, and configured to compare voltage input to the respective input terminals to produce an output signal; and
a counter configured to increase or decrease the code signal using the output signal of the comparator.

20. The apparatus of claim 19, further comprising:
a latch configured to latch the output signal of the comparator, and transmit the latched output signal to the counter.

21. The apparatus of claim 19,
wherein the on-die termination control unit includes:
a plurality of PMOS transistors having respective drain terminals, and configured to receive a power supply voltage through their respective source terminals and are configured to receive the code signal through their respective gate terminals; and
a plurality of resistors that are respectively coupled to the drain terminals of the plurality of PMOS transistors.

22. The apparatus of claim 19,
wherein the offset voltage canceling unit forms a negative feedback loop and stores the offset voltage in the capacitor when a first pulse signal is activated, and
wherein the offset voltage is configured to cancel out the offset voltage stored in the capacitor and compares the capacitor voltage having canceled out the offset voltage with the reference voltage when a second pulse signal is activated.

23. The apparatus of claim 22,
wherein the first pulse signal precharges the offset voltage canceling unit, and
the second pulse signal is activated during an interval when the first pulse signal is not activated.

24. The apparatus of claim 22,
wherein the offset voltage canceling unit includes:
the capacitor coupled between the on-die termination control unit and the comparator; and
a switching unit configured to store the offset voltage in the capacitor and output a sum of the reference voltage and the offset voltage to the comparator when the first pulse signal is activated, and output the reference voltage and the output of the on-die termination control unit having cancelled out the offset voltage to the comparator when the second pulse signal is activated.

25. The apparatus of claim 19,
wherein the comparator has a unity gain and output the sum of the reference voltage and the offset voltage through an output terminal, when the first pulse signal is activated.

26. The apparatus of claim 24,
wherein the comparator has a unity gain and output the sum of the reference voltage and the offset voltage through an output terminal, when the first pulse signal is activated.

27. The apparatus of claim 24,
wherein the switching unit includes:
a first transmission gate that is switched according to the second pulse signal and an inverted signal of the second pulse signal, and outputs the reference voltage to a first node;
a second transmission gate that is switched according to the second pulse signal and the inverted signal of the second pulse signal, and outputs the output of the on-die termination control unit to a second node;
a third transmission gate that is switched according to the first pulse signal and an inverted signal of the first pulse signal, and selectively connects the first node and the second node;
a fourth transmission gate that is switched according to the first pulse signal and the inverted signal of the first pulse signal, and selectively controls the connection between an output terminal of the capacitor and a reference voltage applying terminal; and
a fifth transmission gate that is switched according to the first pulse signal and the inverted signal of the first pulse signal, and selectively controls the connection between an output terminal of the comparator and a negative terminal of the comparator.

28. The apparatus of claim 20,
wherein the latch and the counter are activated according to a third pulse signal.

29. The apparatus of claim 28,
wherein the third pulse signal is activated during an interval when the second pulse signal is activated.

* * * * *